United States Patent
Aoki (10) Patent No.: US 8,252,641 B2
(45) Date of Patent: Aug. 28, 2012

(54) MEMORY EMBEDDED LOGIC SEMICONDUCTOR DEVICE HAVING MEMORY REGION AND LOGIC CIRCUIT REGION

(75) Inventor: Yasuyuki Aoki, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 138 days.

(21) Appl. No.: 12/836,166

(22) Filed: Jul. 14, 2010

(65) Prior Publication Data

US 2011/0049600 A1   Mar. 3, 2011

(30) Foreign Application Priority Data

Aug. 25, 2009   (JP) ................. 2009-194665

(51) Int. Cl.
*H01L 21/8238* (2006.01)
*H01L 21/8242* (2006.01)

(52) U.S. Cl. ........ 438/210; 438/239; 438/396; 438/397; 257/E21.647; 257/E21.649

(58) Field of Classification Search .............. 438/210, 438/239, 396, 397; 257/E21.647, E21.649
See application file for complete search history.

(56) References Cited

U.S. PATENT DOCUMENTS

| | | | | |
|---|---|---|---|---|
| 6,642,093 | B2 * | 11/2003 | Kubo et al. ................ | 438/197 |
| 7,078,759 | B2 * | 7/2006 | Takeuchi ................... | 257/300 |
| 7,199,420 | B2 * | 4/2007 | Kitamura et al. ........... | 257/306 |
| 7,375,389 | B2 * | 5/2008 | Oh et al. ................... | 257/296 |
| 7,439,569 | B2 * | 10/2008 | Takeuchi ................... | 257/308 |
| 2002/0137275 | A1 * | 9/2002 | Chien et al. ............... | 438/241 |
| 2004/0232462 | A1 * | 11/2004 | Takeuchi ................... | 257/296 |
| 2005/0093147 | A1 * | 5/2005 | Tu ........................... | 257/734 |
| 2005/0236655 | A1 * | 10/2005 | Takeuchi ................... | 257/295 |
| 2007/0018217 | A1 * | 1/2007 | Kawamura ................. | 257/296 |
| 2009/0159978 | A1 * | 6/2009 | Matsubara et al. ......... | 257/368 |
| 2010/0213572 | A1 * | 8/2010 | Ching et al. ............... | 257/532 |
| 2010/0297820 | A1 * | 11/2010 | Lee et al. .................. | 438/253 |

FOREIGN PATENT DOCUMENTS

JP   2002-3533334 (A)   12/2002

* cited by examiner

*Primary Examiner* — Ngan Ngo
(74) *Attorney, Agent, or Firm* — Foley & Lardner LLP (57) ABSTRACT

In a method of manufacturing a semiconductor device, first contact holes reaching diffusion regions of a cell transistor, bit line contact holes reaching diffusion regions of the cell transistor, and interconnect grooves communicating with the bit line contact holes are buried in a first insulating film. In addition, first contact plugs and bit line contacts are respectively formed by burying conductive materials in the first contact holes, the bit line contact holes and the interconnect grooves, and the first contact plugs are electrically connected to a capacitor formed in a third insulating film through an opening formed in a second insulating film.

8 Claims, 7 Drawing Sheets

FIG. 1

PRIOR ART

MEMORY REGION | LOGIC REGION

FIG. 8

MEMORY REGION | LOGIC REGION

FIG. 9

MEMORY EMBEDDED LOGIC SEMICONDUCTOR DEVICE HAVING MEMORY REGION AND LOGIC CIRCUIT REGION

The application is based on Japanese patent application No. 2009-194665, the content of which is incorporated hereinto by reference.

BACKGROUND

1. Technical Field

The present invention relates to a memory embedded logic semiconductor device in which a memory section and a logic circuit are integrated on the same semiconductor substrate, and a method of manufacturing the same.

2. Related Art

In memory embedded logic LSIs, a memory section and a logic circuit are integrated on the same semiconductor substrate. Since a cell area of a dynamic random access memory (DRAM) is smaller than a cell area of a static ram (SRAM), DRAM embedded logic LSIs have the advantage of being able to embed memory device of mass storage, and, on the other hand, they have a drawback that a DRAM forming process is required in addition to a process of forming the logic circuit, resulting in a high manufacturing cost. As a structure of a memory cell of the DRAM, two types of structures, called a stack type and a trench type, are known. In the trench type, a deep groove is formed in the semiconductor substrate due to etching, and capacitor materials are buried in this groove. For this reason, there is a problem that a groove having a high aspect ratio has to be formed with a high degree of accuracy, and a capacitor insulating film is required to be uniformly formed within the formed groove, which results in difficulty in thinning down.

Meanwhile, the stack type is classified into a capacitor over bitline (COB) type and a capacitor under bitline (CUB) type. The CUB type structure is a structure in which the capacitor is formed in a layer located further downward than the bit line. On the other hand, in the COB type structure, the capacitor is formed in a layer located further upward than the bit line. In general, the COB type structure has an advantage over the CUB type structure in terms of thinning. Such a COB type structure is disclosed in, for example, Japanese Unexamined Patent Publication No. 2002-353334.

Figure 1:
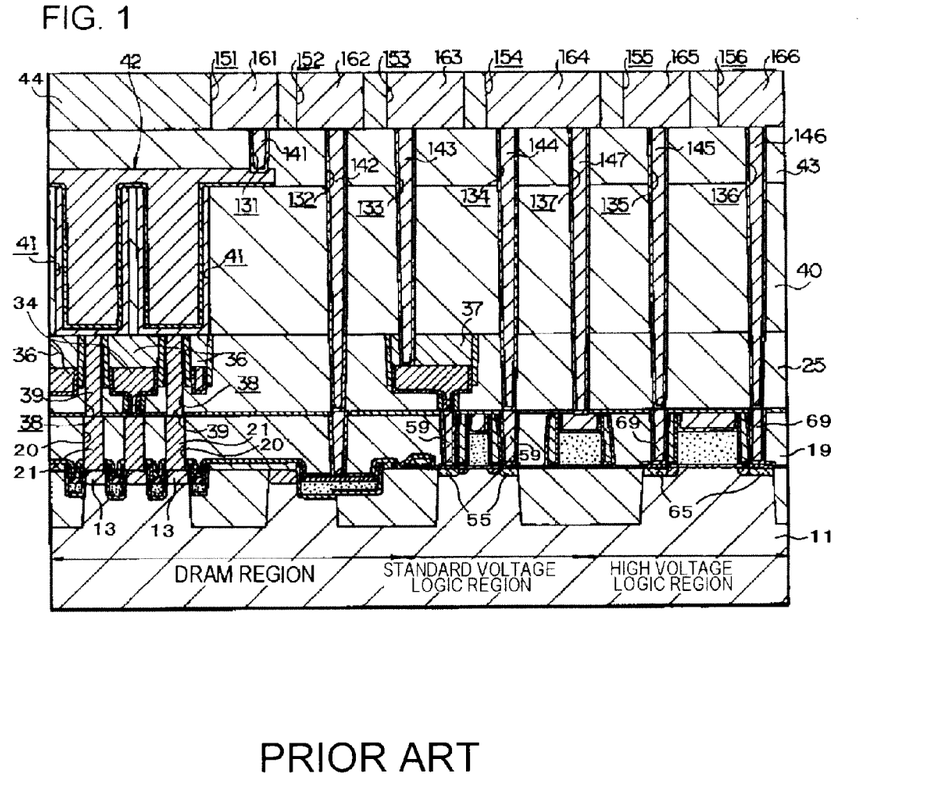
FIG. 1 is a schematic cross-sectional view of a semiconductor device of the related art.

Hereinafter, a DRAM embedded logic semiconductor device including the COB type structure disclosed in Japanese Unexamined Patent Publication No. 2002-353334 will be outlined. FIG. 1 is a schematic cross-sectional view of the semiconductor device. As shown in FIG. 1, the semiconductor device includes a DRAM region in which a memory cell is formed, and a logic region in which a logic circuit is formed, on the same semiconductor substrate 11. A first insulating film 19, a second insulating film 25, a third insulating film 40, a fourth insulating film 43 and a fifth insulating film 44 are sequentially stacked on the semiconductor substrate 11.

In a DRAM region, a bit line 34 is formed within a groove formed in a second insulating film 25, and a capacitor (capacitive element) 42 having a metal-insulator-metal (MIM) structure is formed in a concave portion 41 of a third insulating film 40 located further upward than the bit line 34. Contact holes 20 and 38 are respectively formed in the first insulating film 19 and the second insulating film 25, and a takeoff electrode 21 and a storage node contact plug 39 are buried within the contact holes 20 and 38. The takeoff electrode 21 and the storage node contact plug 39 electrically connect between an impurity diffusion region 13 and the capacitor 42 of a MOS transistor. Interconnect grooves 151 and 152 are formed in the fifth insulating film 44 of the uppermost layer, and interconnects 161 and 162 made of copper and the like are buried in the interconnect grooves 151 and 152. The interconnect 161 is connected to the capacitor 42 through an electrode 141.

On the other hand, contact holes 133, 134, 137, 135, and 136 passing through the second insulating film 25, the third insulating film 40 and the fourth insulating film 43 are formed in the logic regions (standard voltage logic region and high voltage logic region). Takeoff electrodes (contact plugs) 143, 144, 147, 145, and 146 are respectively buried within the contact holes 133, 134, 137, 135, and 136. In addition, takeoff electrodes (contact plugs) 59 and 69 are buried within the contact holes formed in the first insulating film 19. The takeoff electrodes 59 and 69 are connected to impurity diffusion regions (source and drain regions) 55 and 65 through a silicide film. Interconnect grooves 153, 154, 155, and 156 are formed in the fifth insulating film 44 of the uppermost layer, and metal interconnects 163, 164, 165, and 166 made of copper and the like are buried within the interconnect grooves 153, 154, 155, and 156. The takeoff electrodes 59, 69, 143 to 147 electrically connect between the metal interconnects 163 to 166 of the uppermost layer and the impurity diffusion regions (source and drain regions) 55 and 65 of the MOS transistor.

The present inventor has recognized as follows. In the COB type structure of the semiconductor device disclosed in Japanese Unexamined Patent Publication No. 2002-353334, there is a problem that the second insulating film 25 is formed on the first insulating film 19, and then the bit line 34 and the storage node contact 39 are formed in parallel in the second insulating film 25, which results in an increased number of manufacturing processes.

As described above, in the DRAM region, the contact hole 20 is formed in the first insulating film 19 in order to connect the impurity diffusion region 13 to the capacitor 42, and the contact hole 38 is formed in the second insulating film 25. The storage node contact plug 39 and the takeoff electrode 21 are stacked within these contact holes 20 and 38. Accordingly, there is a problem that the aspect ratio of the contact holes 20 and 38 is high, which causes an increase in the connection resistance between the capacitor 42 and the impurity diffusion region 13.

On the other hand, in the logic region, the takeoff electrodes 144 to 146 are formed by forming the contact holes 134 to 136 which pass through the second insulating film 25, the third insulating film 40 and the fourth insulating film 43, and burying metallic materials such as tungsten in these contact holes 134 to 136. Accordingly, there is another problem that the aspect ratio of the contact holes 134 to 136 is high, which causes an increase in the connection resistance.

In general, in the processes of manufacturing the semiconductor device, although the contact hole is formed by performing anisotropic dry etching in which a photoresist is used as a mask with respect to an insulating film, the sidewall adjacent to an opening of the formed contact hole inclines somewhat from the vertical direction. Thus, since an area of the bottom of the contact hole is smaller than an area of the opening, the contact resistance in the bottom thereof increases. Accordingly, when the aspect ratio of the contact holes 20, 38, and 134 to 136 becomes high, the connection resistance increases.

In view of such circumstances, the invention is aimed at providing a semiconductor device having a structure capable of reducing the number of manufacturing processes and realizing a low connection resistance, and a method of manufacturing the same.

SUMMARY

In one embodiment, there is provided a method of manufacturing a semiconductor device, including: forming a cell transistor in a memory region of a semiconductor substrate, and forming a logic device in a logic region of the semiconductor substrate; forming a first insulating film for coating both the cell transistor and the logic device over the semiconductor substrate; forming a bit line interconnect groove by selectively processing the first insulating film by etching; forming a first contact hole reaching a first diffusion region of the cell transistor by selectively processing the first insulating film by etching, and forming a bit line contact hole which reaches a second diffusion region of the cell transistor and communicates with the interconnect groove; forming a first contact plug by burying a conductive material in the first contact hole, and forming a bit line contact plug and a bit line by burying a conductive material in the bit line contact hole and the interconnect groove; forming a second insulating film for coating the first contact plug and the bit line over the first insulating film; forming a first opening reaching the first contact plug by selectively processing the second insulating film by etching; forming a third insulating film over the second insulating film after forming the first opening; forming a concave portion communicating with the first opening by processing the third insulating film by etching; and forming a capacitor, which is electrically connected to the first contact plug through the first opening, in the concave portion.

As described above, in the method of manufacturing the semiconductor device according to the invention, the first contact hole reaching the first diffusion region of the cell transistor, the bit line contact hole reaching the second diffusion region of the cell transistor, and the interconnect groove communicating with the bit line contact hole are buried in the same insulating film (first insulating film), and the first contact plug, the bit line contact plug and the bit line are respectively formed by burying the conductive materials in the first contact hole, the bit line contact hole and the interconnect groove. Further, in the manufacturing method, the first contact plug is electrically connected to the capacitor formed in the third insulating film on the second insulating film through the first opening formed in the second insulating film. Hereby, the distance between the capacitor and the first diffusion region of the cell transistor may be shortened, to thereby allow the connection resistance between the capacitor and the cell transistor to be lowered.

In addition, since the aspect ratio of the first contact hole is relatively small, it is possible to secure sufficient connection resistance even when the size (opening diameter) of the first opening is reduced. For this reason, it is possible to prevent short circuit between the conductive material within the first opening and the bit line by reducing the size (opening diameter) of the first opening.

In addition, the first contact plug and the bit line may be simultaneously formed by simultaneously burying the conductive materials in the first contact hole and the interconnect groove, to thereby allow the number of processes to be reduced.

In another embodiment, there is provided a semiconductor device including: a cell transistor formed in a memory region of a semiconductor substrate; a logic device formed in a logic region of the semiconductor substrate; a first insulating film formed over the semiconductor substrate so as to coat both the cell transistor and the logic device; a first contact plug which is buried in the first insulating film, and is electrically connected to a first diffusion region of the cell transistor; a bit line contact plug which is buried in the first insulating film, and is electrically connected to a second diffusion region of the cell transistor; a bit line which is buried in the first insulating film, and is connected to the upper portion of the bit line contact plug; a second insulating film which is formed over the first insulating film so as to coat the bit line, and has a first through hole; a third insulating film formed over the second insulating film; and a capacitor which is buried in the third insulating film, and is electrically connected to the first contact plug through the first through hole.

As described above, in the semiconductor device according to the invention, any of the bit line contact plug, the bit line and the first contact plug is buried in the first insulating film, and the first contact plug is electrically connected to the capacitor within the third insulating film through the first through hole formed in the second insulating film. Therefore, the distance between the capacitor and the first diffusion region of the cell transistor may be shortened, to thereby allow the connection resistance between the capacitor and the cell transistor to be lowered.

In addition, since the aspect ratio of the first contact hole is relatively small, it is possible to secure sufficient connection resistance even when the size (opening diameter) of the first opening is reduced. For this reason, it is possible to prevent short circuit between the first opening and the bit line by reducing the size (opening diameter) of the first opening.

According to the invention, it is possible to lower the connection resistance between the capacitor and the cell transistor. In addition, it is possible to suppress the cost of manufacturing the semiconductor device by reducing the number of manufacturing processes.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, the embodiment of the invention will be described with reference to the accompanying drawings. In all the drawings, like elements are referenced by like reference numerals and descriptions thereof will not be repeated.

Figure 2:
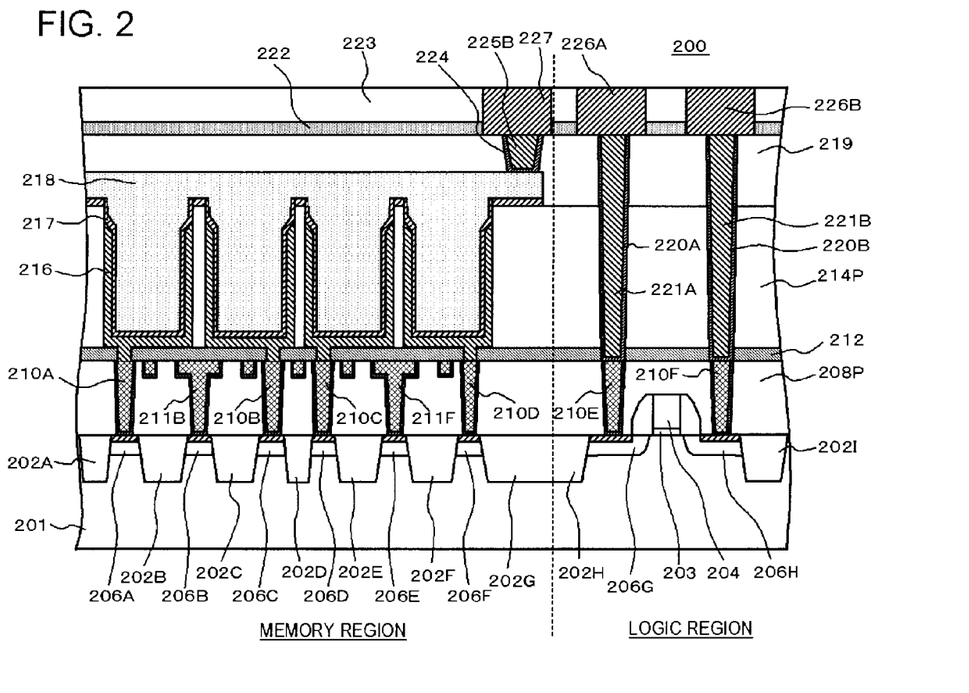
FIG. 2 is a cross-sectional view illustrating the schematic configuration of a semiconductor device according an embodiment of the invention.

FIG. 2 is a cross-sectional view illustrating the schematic configuration of a semiconductor device 200 according to an embodiment of the invention. The semiconductor device 200 includes a cell transistor (not shown) formed in a memory region of a semiconductor substrate 201, and a logic device formed in a logic region of the semiconductor substrate 201. This logic device includes a logic transistor. In FIG. 2, the logic transistor having a gate oxide film 203, a gate electrode 204 and diffusion regions (source and drain regions) 206G and 206H are shown.

A first insulating interlayer 208P, a second insulating interlayer 212, a third insulating interlayer 214P, a fourth insulating interlayer 219, a fifth insulating interlayer 222 and a sixth insulating interlayer 223 are formed on the semiconductor substrate 201 in this order, over both the memory region and the logic region.

The first insulating interlayer 208P is formed so as to coat both the cell transistor and the logic device which are formed on the semiconductor substrate 201. In the memory region, contact plugs 210A, 210B, 210C, and 210D which are electrically connected to the diffusion regions (source and drain regions: first diffusion regions) 206A, 206C, 206D, and 206F of the cell transistor, respectively, are buried within the first insulating interlayer 208P.

In addition, bit line contacts 211B and 211F having a T-shaped cross section which are electrically connected to the diffusion regions (source and drain regions: second diffusion regions) 206B and 206E of the cell transistor, respectively, are buried within the first insulating interlayer 208P. Each of the bit line contacts 211B and 211F is constituted by a bit line contact plug connected to the diffusion region 206B or 206E within the semiconductor substrate 201, and a bit line continuously connected to the upper portion of this bit line contact plug.

The second insulating interlayer 212 coats the bit line contacts 211B and 211F and has a plurality of through holes. A capacitor electrically connected to the contact plugs 210A, 210B, and 210C, 210D within the first insulating interlayer 208P through these through holes is buried in the third insulating interlayer 214P. As shown in FIG. 2, this capacitor has a metal-insulator-metal (MIM) structure which is constituted by a lower electrode layer 216 electrically connected to the contact plugs 210A to 210D, a dielectric film 217 for coating the lower electrode layer 216, and an upper electrode layer 218 formed on the dielectric film 217.

In the logic region, contact plugs 210E and 210F which are electrically connected to the diffusion regions (source and drain regions) 206G and 206H of the logic transistor, respectively, are buried within the first insulating interlayer 208P. Upper portion contact plugs 221A and 221B which are electrically connected to upper interconnects 226A and 226B, respectively, are buried within the third insulating interlayer 214P and the fourth insulating interlayer 219, and these upper contact plugs 221A and 221B are connected to the contact plugs 210E and 210F through a through hole (second through hole) formed in the second insulating interlayer 212.

The upper surfaces of the first insulating interlayer 208P, the contact plugs 210A to 210D, the bit line contact 211B and 211F, and the contact plugs 210E and 210F are planarized and located at the same plane. For this reason, it is possible to thin the second insulating interlayer 212 to be equal to or less than 50 nm in thickness, without planarizing the upper surface of the second insulating interlayer 212 formed on the first insulating interlayer 208P by a CMP process.

Figure 3:
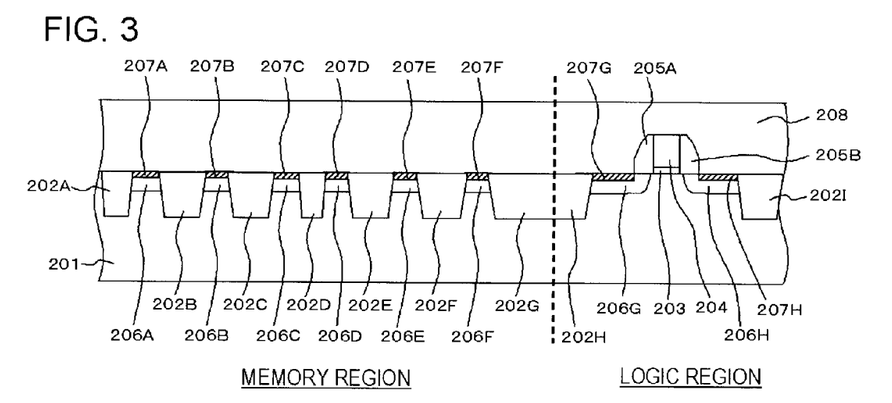
FIG. 3 is a cross-sectional view schematically illustrating a process of a method of manufacturing the semiconductor device according to the embodiment.
Figure 4:
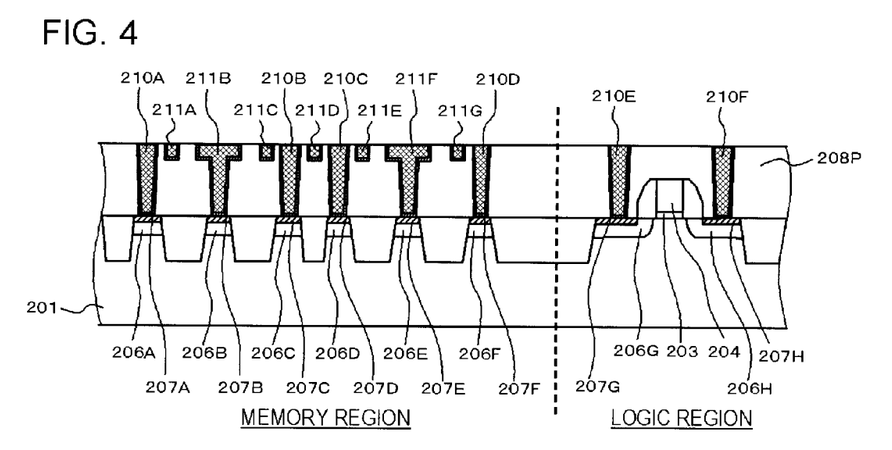
FIG. 4 is a cross-sectional view schematically illustrating a process of a method of manufacturing the semiconductor device according to the embodiment.
Figure 5:
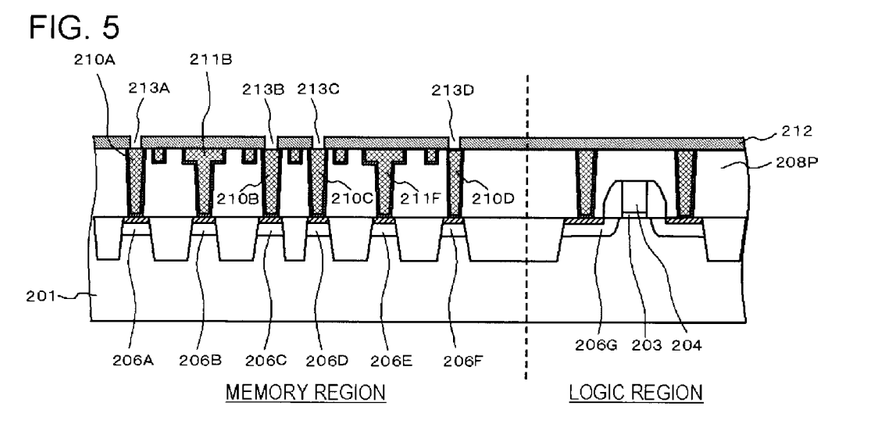
FIG. 5 is a cross-sectional view schematically illustrating a process of a method of manufacturing the semiconductor device according to the embodiment.
Figure 6:
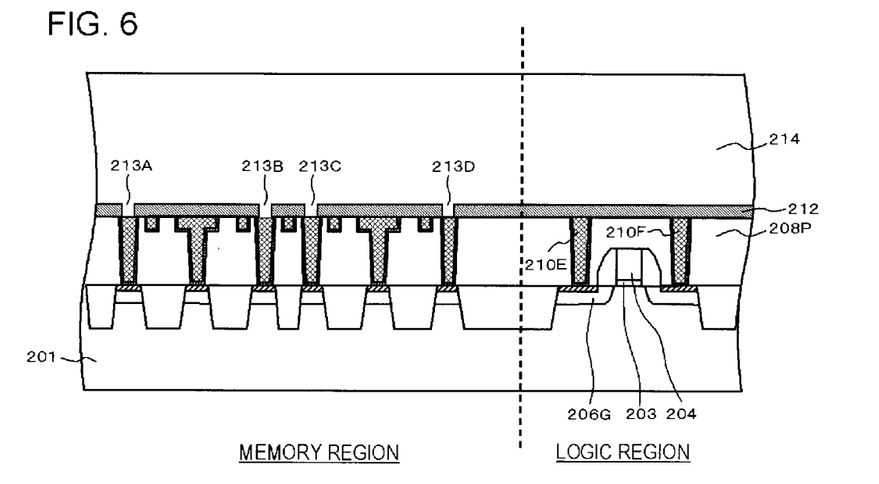
FIG. 6 is a cross-sectional view schematically illustrating a process of a method of manufacturing the semiconductor device according to the embodiment.
Figure 7:
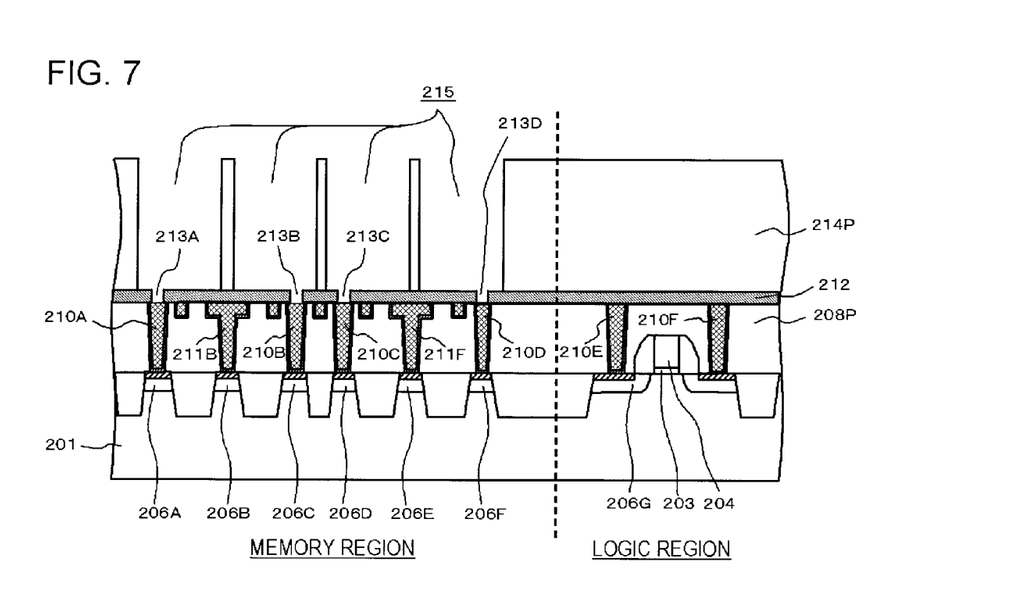
FIG. 7 is a cross-sectional view schematically illustrating a process of a method of manufacturing the semiconductor device according to the embodiment.
Figure 8:
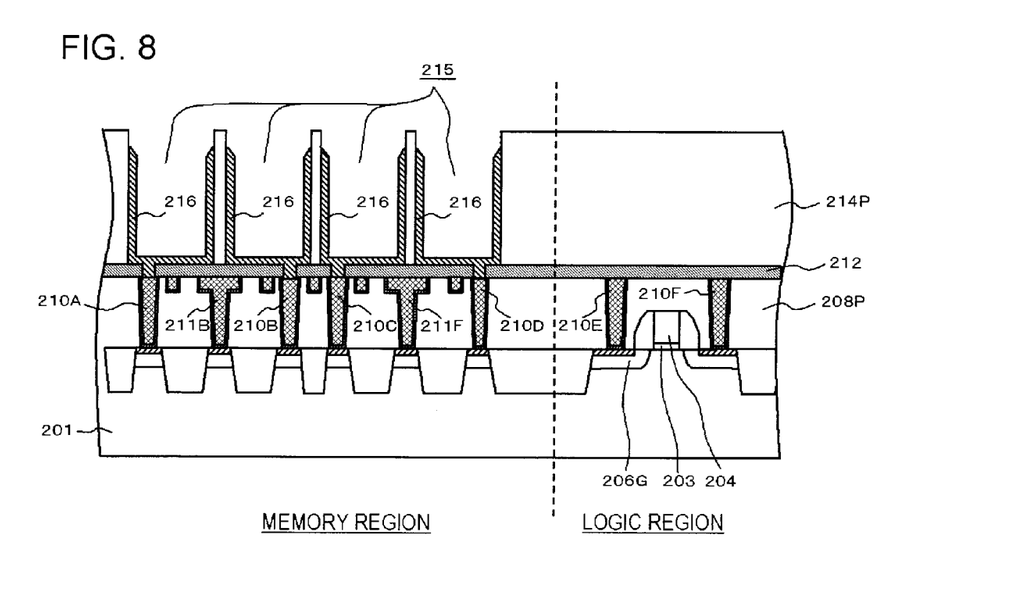
FIG. 8 is a cross-sectional view schematically illustrating a process of a method of manufacturing the semiconductor device according to the embodiment.
Figure 9:
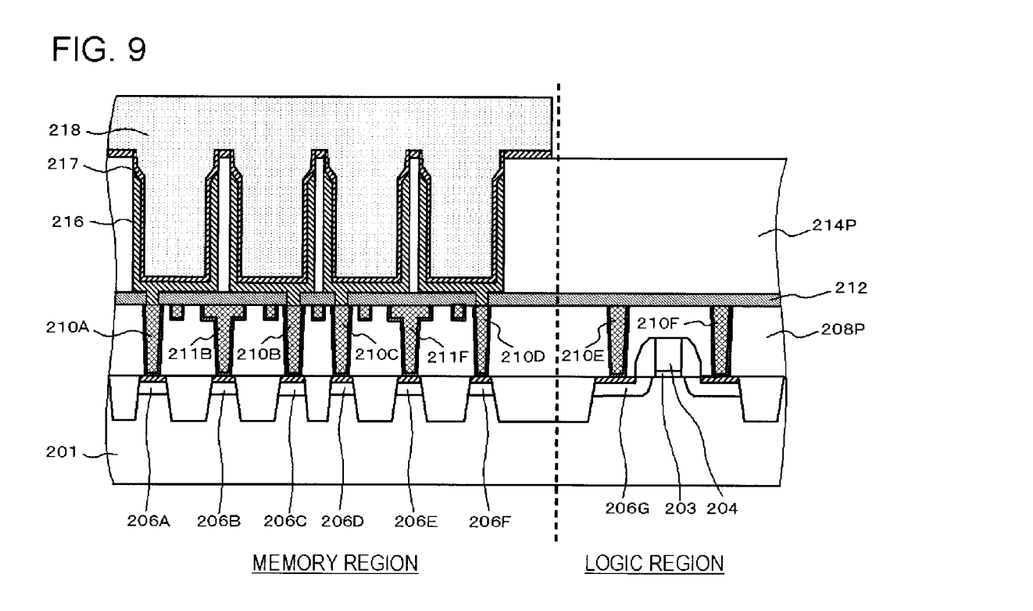
FIG. 9 is a cross-sectional view schematically illustrating a process of a method of manufacturing the semiconductor device according to the embodiment.

FIGS. 3 to 9 are cross-sectional views schematically illustrating the processes of the method of manufacturing the above-mentioned semiconductor device 200. This method of manufacturing the same includes:

(a) forming a cell transistor in a memory region of the semiconductor substrate 201, and forming a logic device in a logic region of the semiconductor substrate 201 (FIG. 3);

(b) forming a first insulating interlayer 208 for coating both the cell transistor and the logic device on the semiconductor substrate 201 (FIG. 3);

(c) forming a bit line interconnect groove by selectively processing the first insulating interlayer 208 by etching (FIG. 4);

(d) forming a first contact hole reaching the first diffusion region 206A, 206C, 206D, and 206F of the cell transistor by selectively processing the first insulating interlayer 208 by etching, and forming a bit line contact hole which reaches the second diffusion regions 206B and 206E of the cell transistor and communicates with the interconnect groove (FIG. 4);

(e) forming contact plugs 210A to 210D by burying a conductive material in the first contact hole, and forming bit line contacts 211A, 211B, 211C, 211D, 211E, 211F, and 211G constituted by a bit line contact plug and a bit line by burying a conductive material in the bit line contact hole and the interconnect groove (FIG. 4);

(f) forming a second insulating interlayer 212 for coating the contact plugs 210A to 210D and the bit line contacts 211A to 211F on the first insulating interlayer 208P (FIG. 5);

(g) forming openings 213A to 213D reaching the contact plugs 210A to 210D by selectively processing the second insulating interlayer 212 by etching (FIG. 5);

(h) forming a third insulating interlayer 214 on the second insulating interlayer 212 after the step (g) (FIG. 6);

(i) forming a concave portion 215 communicating with the openings 213A to 213D by processing the third insulating interlayer 214 by etching (FIG. 7); and (j) forming a capacitor, which is electrically connected to the contact plugs 210A to 210D through the openings 213A to 213D, in the concave portion 215 (FIGS. 8 and 9).

Hereinafter, the manufacturing method according to the embodiment will be described in more detail.

As shown in FIG. 3, in the memory region, element isolation regions 202A to 202G are formed in the semiconductor substrate 201, and in the logic region, element isolation regions 202H and 202I are formed in the semiconductor substrate 201. These element isolation regions 202A to 202G, 202H, and 202I are formed by, for example, forming grooves by a shallow trench isolation (STI) method, filling an insulating film in the grooves and planarizing it. A cell transistor (for example, DRAM transistor) or a logic transistor is formed in a transistor forming region isolated by these element isolation regions 202A to 202G.

As shown in FIG. 3, in the memory region, the diffusion regions 206A to 206F which are source and drain regions of the cell transistor are formed in the upper layer of the semiconductor substrate 201. Silicide layers (salicide) 207A to 207F of nickel silicide and the like are respectively formed on these diffusion regions 206A to 206F. On the other hand, in the logic region, the gate electrode 204 is formed on the semiconductor substrate 201 through the gate oxide film 203, and sidewall spacers 205A and 205B for coating both sides of the gate electrode 204 are formed thereon. The diffusion regions (source and drain regions) 206G and 206H are formed on the upper layer of the semiconductor substrate 201 in a self alignment manner, by ion implantation in which the sidewall spacers 205A and 205B and the element isolation region 202H and 202I are used as a mask. Further, silicide layers (salicide) 207G and 207H of nickel silicide and the like are respectively formed on these diffusion regions 206G and 206H.

Next, the first insulating interlayer 208 (FIG. 3) is formed by depositing a silicon oxide film and the like on the semiconductor substrate 201 so as to coat the above-mentioned cell transistor or the logic transistor, and planarizing the upper surface of the silicon oxide film by a CMP method.

After the first insulating interlayer 208 is formed, the interconnect grooves in which the upper portions (bit lines) of the bit line contacts 211A to 211G of FIG. 4 are buried are formed by patterning the first insulating interlayer 208 by photolithography and selective etching.

Subsequently, the contact holes in which the contact plugs 210A to 210D of FIG. 4 are buried are formed by patterning the first insulating interlayer 208 by photolithography and selective etching, and the contact holes in which the contact plugs 210E and 210F of FIG. 4 are buried are formed. Each of these contact holes exposes the silicide layers 207A, 207C, 207D, 207F, 207G, and 207H on the diffusion regions 206A, 206C, 206D, 206F, 206G, and 206H. Simultaneously, the bit line contact holes in which the lower portions (bit line contact plugs) of the bit line contacts 211A to 211G are buried are also formed in the first insulating interlayer 208. The bit line contact holes in which the lower portions of the bit line contact holes 211B and 211F shown in FIG. 4 are buried expose silicide layers 207B and 207F on the diffusion regions 206B and 206F.

Meanwhile, in the embodiment, although the step of forming the contact holes or the bit line contact holes is executed after executing the step of forming the interconnect grooves, the procedure of these steps may be changed.

After that, barrier metals such as titanium nitride are formed in the above-mentioned contact holes, the bit line contact holes and the interconnect grooves by a chemical vapor deposition (CVD) method and the like. Further, the conductive materials such as tungsten are buried in the above-mentioned contact holes, the bit line contact holes and the interconnect grooves through these barrier metals. Subsequently, the contact plugs 210A to 210D, the bit line contacts 211A to 211G and the contact plugs 210E and 210F are simultaneously formed by removing the extra barrier metals or the conductive materials by the CMP process. Simultaneously, the upper surfaces of the contact plugs 210A to 210D, the bit line contacts 211A to 211G and the contact plugs 210E and 210F are planarized with no asperity by this CMP process. As a result, as shown in FIG. 4, the first insulating interlayer 208P is formed in which the contact plugs 210A to 210D, the bit line contacts 211A to 211G and the contact plugs 210E and 210F are buried.

Meanwhile, although the lower portions of the bit line contacts 211A, 211C, 211D, 211E, and 211G are not shown in a cross-sectional view of FIG. 4, they are connected to the silicide layers on the diffusion regions which are not shown in FIG. 4.

Figure 10:
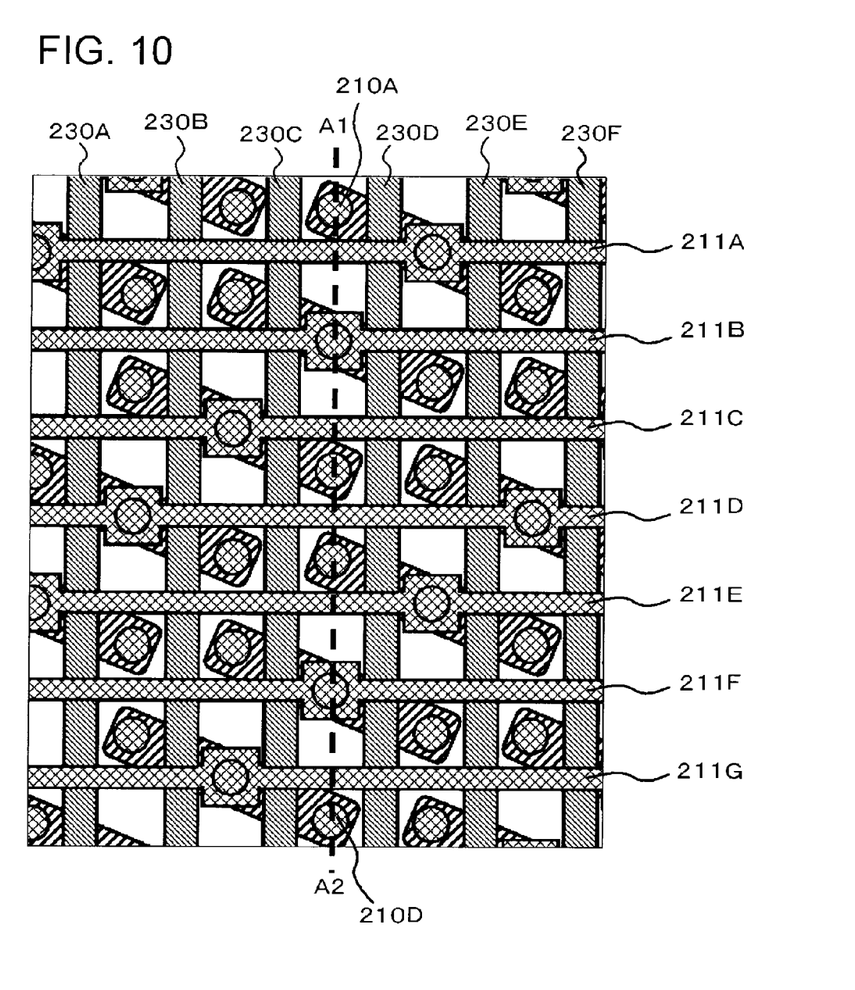
FIG. 10 is a diagram schematically illustrating the upper surface of a structure of a memory region in a stacked structure shown in FIG. 4.

FIG. 10 is a diagram schematically illustrating the upper surface of the structure of the memory region in the stacked structure shown in FIG. 4. A cross-sectional view taken along the line A1-A2 of FIG. 10 corresponds to the cross-sectional view of FIG. 4. For convenience of description, the first insulating interlayer 208P is not shown in FIG. 10. As shown in FIG. 10, the gate electrodes 230A to 230F making up a plurality of cell transistors are arranged in parallel, and the bit line contacts 211A to 211G are arranged in parallel so as to intersect these gate electrodes 230A to 230F.

Next, the second insulating interlayer 212 made of a nitride film such as silicon nitride having a thickness of 50 nm or so is deposited on the first insulating interlayer 208P. Subsequently, the second insulating interlayer 212 is patterned by photolithography and selective etching. As a result, as shown in FIG. 5, the openings 213A to 213D for exposing the contact plugs 210A to 210D, respectively, are formed in the second insulating interlayer 212.

Next, as shown in FIG. 6, the third insulating interlayer 214 in which an MIM capacitor is buried is formed. The concave portion 215 (FIG. 7) communicating with the openings 213A to 213D of the second insulating interlayer 212 is formed by processing the third insulating interlayer 214 by photolithography and dry etching. The dry etching in this case is executed in a condition where the selective ratio of the third insulating interlayer 214 to the second insulating interlayer 212 is sufficiently high. Hereby, it is possible to expose the upper surfaces of the contact plugs 210A to 210D once again by removing the insulating materials buried in the openings 213A to 213D.

Next, an electrode layer such as titanium nitride is grown in the bottom of the concave portion 215 and the sidewall thereof. Subsequently, after a resist is buried in the concave portion 215, and etch back is performed, the lower electrode layer 216 shown in FIG. 8 is formed by removing the resist. At this time, the conductive materials buried in the openings 213A to 213D become through hole portions, to thereby electrically connect between the lower electrode layers 216 and the contact plugs 210A to 210D.

Next, as shown in FIG. 9, the dielectric film 217 used as a capacitive film is grown so as to coat the lower electrode layer 216, and after that, an electrode layer such as titanium nitride is grown on the dielectric film 217. The dielectric film 217 and the upper electrode layer 218 shown in FIG. 9 are formed by patterning the dielectric film 217 and the electrode layer by photolithography and selective etching. As a result, a capacitor having an MIM structure is formed in which the dielectric film 217 is interposed between the lower electrode layer 216 and the upper electrode layer 218.

After that, the fourth insulating interlayer 219 is deposited on the stacked structure of FIG. 9. Next, in the memory region, an interconnect groove is formed by processing the fourth insulating interlayer 219 by photolithography and selective etching, and a barrier metal 224 and an upper contact plug 225B which are electrically connected to the upper electrode layer 218 are formed in this interconnect groove.

On the other hand, in the logic region, the openings, which pass through the fourth insulating interlayer 219 and the third insulating interlayer 214 and reach the contact plugs 210E and 210F of the first insulating interlayer 208P, respectively, are formed by selective etching. Next, the barrier metal films such as titanium nitride are formed in these openings, and the conductive materials such as tungsten are buried in the openings through these barrier metal films. After that, the CMP process is executed. As a result, the upper contact plug 221A connected to the contact plug 210E through a barrier metal 220A, and the upper contact plug 221B connected to the contact plug 210F through a barrier metal 220B are formed within the fourth insulating interlayer 219 and the third insulating interlayer 214P shown in FIG. 2.

After that, the fifth insulating interlayer 222 and the sixth insulating interlayer 223 are formed in which copper interconnects 226A, 226B, and 227 are buried. The copper interconnects 226A and 226B are electrically connected to the upper contact plugs 221A and 221B, respectively, and the copper interconnect 227 is electrically connected to the upper contact plug 225B.

As described above, in the method of manufacturing the semiconductor device 200 according to the embodiment, the contact holes reaching the diffusion regions 206A, 206C, 206D, and 206F, the bit line contact holes reaching the diffusion regions 206B and 206E, and the interconnect grooves communicating with the bit line contact holes are buried in the same insulating film 208P. Since the contact plugs 210A to 210D and the bit line contacts 211B and 211F are simultaneously formed by burying the conductive materials in the first contact holes, the bit line contact holes and the interconnect grooves, the number of processes can be reduced.

Further, in the manufacturing method, the contact plugs 210A to 210D are electrically connected to the capacitor formed in the third insulating interlayer 214P on the second insulating interlayer 212 through the openings 213A to 213D (FIG. 5) formed in the second insulating interlayer 212. For this reason, since the distance between the capacitor and the diffusion regions 206A, 206C, 206D, and 206F of the cell transistor can be shortened, the connection resistance between the capacitor and the cell transistor can be lowered. Hereby, an improvement in integration or an improvement in yield ratio can be achieved.

In addition, since the aspect ratio of the contact holes in which the contact plugs 210A to 210D are buried is relatively small, it is possible to secure sufficient connection resistance even when the sizes (opening diameters) of the openings 213A to 213D are reduced. For this reason, it is possible to prevent short circuit between the conductive material within the openings 213A to 213D and the bit line by reducing the sizes (opening diameters) of the openings 213A to 213D.

As described above, although the embodiments of the invention have been set forth with reference to the drawings, they are merely illustrative of the invention, and various configurations other than those stated above can be adopted.

It is apparent that the present invention is not limited to the above embodiment, but may be modified and changed without departing from the scope and spirit of the invention.

What is claimed is:

1. A method of manufacturing a semiconductor device, comprising:
    forming a cell transistor in a memory region of a semiconductor substrate, and forming a logic device in a logic region of said semiconductor substrate;
    forming a first insulating film for coating both said cell transistor and said logic device over said semiconductor substrate;
    forming a bit line interconnect groove by selectively processing said first insulating film by etching;
    forming a first contact hole reaching a first diffusion region of said cell transistor by selectively processing said first insulating film by etching, and forming a bit line contact hole which reaches a second diffusion region of said cell transistor and communicates with said interconnect groove;
    forming a first contact plug by burying a conductive material in said first contact hole, and forming a bit line contact plug and a bit line, respectively, by burying a conductive material in said bit line contact hole and said interconnect groove;
    forming a second insulating film for coating said first contact plug and said bit line over said first insulating film;
    forming a first opening reaching said first contact plug by selectively processing said second insulating film by etching;
    forming a third insulating film over said second insulating film after forming said first opening;
    forming a concave portion communicating with said first opening by processing said third insulating film by etching; and
    forming a capacitor, which is electrically connected to said first contact plug through said first opening, in said concave portion.

2. The method of manufacturing the semiconductor device as set forth in claim 1, further comprising:
    forming a second contact hole reaching said logic device by selectively processing said first insulating film by etching; and
    forming a second contact plug by burying a conductive material in said second contact hole,
    wherein said step of forming the first contact hole and said step of forming the second contact hole are simultaneously executed using the same mask pattern.

3. The method of manufacturing the semiconductor device as set forth in claim 2,
    wherein said second insulating film is formed by the same step over both said memory region and said logic region.

4. The method of manufacturing the semiconductor device as set forth in claim 3, further comprising forming a second opening reaching said second contact plug by selectively processing said second insulating film by etching,
    wherein said step of forming the first opening and said step of forming the second opening are simultaneously executed using the same mask pattern.

5. The method of manufacturing the semiconductor device as set forth in claim 4, further comprising:
    forming a third contact hole communicating with said second opening by selectively processing said third insulating film by etching; and
    forming a third contact plug by burying a conductive material in said third contact hole and said second opening.

6. The method of manufacturing the semiconductor device as set forth in claim 1, further comprising planarizing the surface of a stacked structure including said first insulating film, said first contact plug and said bit line contact plug, immediately before said step of forming the second insulating film.

7. The method of manufacturing the semiconductor device as set forth in claim 1, said second insulating film is a nitride film.

8. The method of manufacturing the semiconductor device as set forth in claim 1, wherein said step of forming the capacitor includes:
    forming a first electrode layer electrically connected to said first contact plug in said first opening and said concave portion;
    forming a dielectric film for coating said first electrode layer; and
    forming a second electrode layer over said dielectric film.

* * * * *